US009299892B2

(12) United States Patent
Jeong

(10) Patent No.: US 9,299,892 B2
(45) Date of Patent: Mar. 29, 2016

(54) LIGHT EMITTING DEVICE, LIGHT EMITTING DEVICE PACKAGE AND IMAGE DISPLAY DEVICE INCLUDING THE SAME

(75) Inventor: Hwan Hee Jeong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 1235 days.

(21) Appl. No.: 13/225,774

(22) Filed: Sep. 6, 2011

(65) Prior Publication Data

US 2012/0057105 A1 Mar. 8, 2012

(30) Foreign Application Priority Data

Sep. 7, 2010 (KR) .................. 10-2010-0087364

(51) Int. Cl.
*H01L 33/40* (2010.01)
*H01L 33/38* (2010.01)
*H01L 33/00* (2010.01)

(52) U.S. Cl.
CPC .............. *H01L 33/40* (2013.01); *H01L 33/38* (2013.01); *H01L 33/0079* (2013.01); *H01L 2933/0016* (2013.01)

(58) Field of Classification Search
CPC ......... H01L 33/20; H01L 33/36; H01L 33/38; H01L 33/405; H01L 33/10; H01L 33/22; H01L 33/002; H01L 33/145; H01L 33/40; G02F 1/1335
See application file for complete search history.

(56) References Cited

U.S. PATENT DOCUMENTS

| 6,268,618 | B1 | 7/2001 | Miki et al. ............... 257/99 |
| 6,281,526 | B1 | 8/2001 | Nitta et al. ............. 257/103 |
| 2008/0308829 | A1* | 12/2008 | Liu et al. ............... 257/98 |
| 2009/0008668 | A1 | 1/2009 | Matsumura ............. 257/98 |

FOREIGN PATENT DOCUMENTS

| CN | 1549032 A | 11/2004 |
| CN | 1585143 A | 2/2005 |
| CN | 101711432 A | 5/2010 |
| DE | 10 2005 008 056 A1 | 7/2006 |
| EP | 1 104 031 A2 | 5/2001 |
| EP | 2 264 793 A2 | 12/2010 |
| KR | 10-2008-0058954 A | 6/2008 |
| KR | 10-2010-0029765 A | 3/2010 |
| KR | 10-2010-0058072 A | 6/2010 |
| KR | 10-2010-0093982 A | 8/2010 |
| KR | 10-2010-0095975 A | 9/2010 |
| WO | WO 2008/154573 A1 | 12/2008 |
| WO | WO 2009/145502 A2 | 12/2009 |

OTHER PUBLICATIONS

European Search Report dated Oct. 1, 2014 issued in Application No. 11 180 168.4.

* cited by examiner

*Primary Examiner* — Jose R Diaz
(74) *Attorney, Agent, or Firm* — Ked & Associates, LLP

(57) ABSTRACT

A light emitting device includes a light emitting structure comprising a first conductivity type semiconductor layer, an active layer and a second conductivity type semiconductor layer; a first electrode arranged on the first conductivity type semiconductor layer; an ohmic layer arranged on a predetermined area of the second conductivity type semiconductor layer; a silicide layer arranged on the ohmic layer, with contacting with the second conductivity type semiconductor layer; and a conductive supporting substrate arranged on the silicide layer.

20 Claims, 19 Drawing Sheets

LIGHT EMITTING DEVICE, LIGHT EMITTING DEVICE PACKAGE AND IMAGE DISPLAY DEVICE INCLUDING THE SAME

CROSS REFERENCE TO RELATED APPLICATION

This application claims the benefit of the Patent Korean Application No. 10-2010-0087364, filed on Sep. 7, 2010, which is hereby incorporated by reference as if fully set forth herein.

BACKGROUND OF THE DISCLOSURE

1. Field of the Disclosure

The embodiment relates to a light emitting device, a light emitting device package and an image display device including the same.

2. Discussion of the Related Art

Owing to development of thin film growth and thin film device elements, a light emitting device including a light emitting diode and a laser diode, which uses a 3-5 group or 2-6 group compound semiconductor element of a semiconductor, can realize a variety of colors such as red, green and blue colors and an infrared ray. Fluorescence material usage or color combination enables a white light having good luminous efficiency to be realized.

Owing to the development of such the technology, the light emitting device has been applied to a transmission module of light communication means, a light emitting diode backlight replacing a cold cathode fluorescence lamp (CCFL) composing a backlight of a liquid crystal display (LCD) device, a white light emitting diode lightening device replacing a fluorescent lamp and an incandescent lamp, a headlight of a vehicle and even to a traffic light broadly.

Here, in the structure of the LED, a P-electrode, an active layer and an N-electrode may be sequentially multi-layered on a substrate and the substrate is bolded with the N-electrode by a wire. Because of that, currents may be electric-conducted to the substrate and the N-electrode.

At this time, currents are applied to the substrate and the currents are then supplied to the 2-electrode and the N-electrode. Because of that, a hole (+) is discharged to the active layer from the P-electrode and an electrode (−) is discharged to the active layer from the N-electrode. After that, an energy level is lowered as the hole and the electrode are combined at the active layer. The energy discharged simultaneously when the energy level is lowered may be emitted as light.

SUMMARY OF THE DISCLOSURE

An object of the embodiment is to reduce optical loss of a light emitting device and to acquire device stability.

Additional advantages, objects, and features of the disclosure will be set forth in part in the description which follows and in part will become apparent to those having ordinary skill in the art upon examination of the following or may be learned from the embodiment. The objectives and other advantages of the embodiment may be realized and attained by the structure particularly pointed out in the written description and claims hereof as well as the appended drawings. To achieve these objects and other advantages and in accordance with the purpose of the disclosure, as embodied and broadly described herein, a light emitting device includes a light emitting structure comprising a first conductivity type semiconductor layer, an active layer and a second conductivity type semiconductor layer; a first electrode disposed on the first conductivity type semiconductor layer; an ohmic layer disposed on a predetermined area of the second conductivity type semiconductor layer; a silicide layer disposed on the ohmic layer, with contacting with the second conductivity type semiconductor layer; and a conductive supporting substrate disposed on the silicide layer.

The ohmic layer may be disposed to expose the second conductivity type semiconductor layer partially and the silicide layer surrounds the ohmic layer, with contacting at least a predetermined exposed area of the second conductivity type semiconductor layer directly.

The silicide layer may be configured of a plurality of layer.

The silicide layer may be a compound of Si and at least one of Ni, Pt, Ti, W, Cu, V, Fe or Mo.

The silicide layer may contacts at least one predetermined area of the second conductivity type semiconductor layer directly, corresponding to the first electrode.

The ohmic layer may be patterned to expose the second conductivity type semiconductor layer partially.

The light emitting device may further include a reflection layer disposed on the ohmic layer and the silicide layer.

The light emitting device may further include a current blocking layer disposed between the second conductivity type semiconductor layer and the silicide layer.

The silicide layer may contact at least predetermined area of the ohmic layer directly, corresponding to the first electrode.

The light emitting device may further include an adhesive layer disposed between the silicide layer and the conductive supporting substrate.

A passivation layer may be formed on a side surface of the light emitting structure and at least predetermined area of the siliside layer.

An unevenness may be formed on a surface of the first conductivity type semiconductor layer.

In another aspect of the embodiment, a light emitting device package includes a package body in which a cavity is formed; first and second electrode layers disposed on the package body, with being electrically separated from each other; and a light emitting device disposed on the cavity, with being electrically connected with the first and second electrode layers, wherein the light emitting device comprises a light emitting structure comprising a first conductivity type semiconductor layer, an active layer and a second conductivity type semiconductor layer; a first electrode disposed on the first conductivity type semiconductor layer; an ohmic layer disposed on a predetermined area of the second conductivity type semiconductor layer; a silicide layer disposed on the ohmic layer, with contacting with the second conductivity type semiconductor layer; and a conductive supporting substrate disposed on the silicide layer.

In a further aspect of the embodiment, an image display device includes a circuit board; a light emitting device package disposed on the circuit board, the light emitting device package comprising a package body in which a cavity is formed; first and second electrode layers disposed on the package body, with being electrically separated from each other; and a light emitting device disposed on the cavity, with being electrically connected with the first and second electrode layers; an optical member configured to project a light emitted from the light emitting device package; and a panel comprising a first transparent substrate, a second transparent substrate, a plurality of liquid crystals located between the first and second transparent substrate and a polarizing plate disposed on each of the first and second transparent substrates, the panel configured to transport the light projected from the optical member.

As a result, the light emitting device According to the embodiment may reduce optical loss and enhance stability thereof.

It is to be understood that both the foregoing general description and the following detailed description of the embodiment are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure.

In the drawings.

DESCRIPTION OF SPECIFIC EMBODIMENTS

Figure 1A:
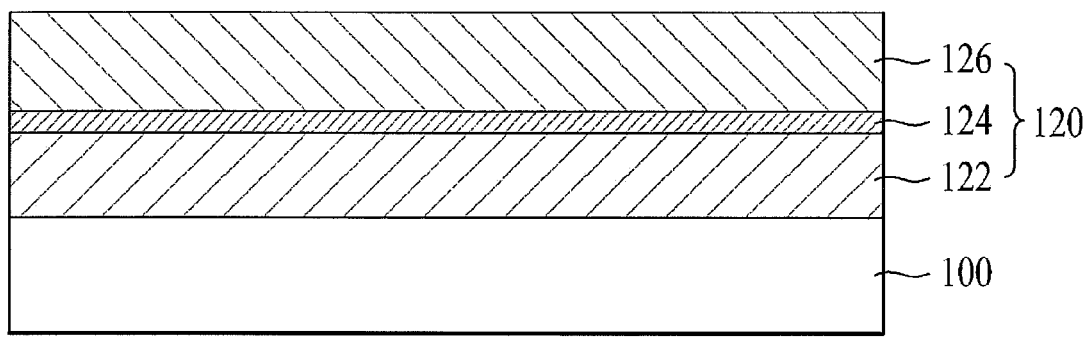
FIGS. 1a through 1g are diagrams illustrating a method of manufacturing a light emitting device according to a first embodiment.

As follows, exemplary embodiments will be described in reference to the accompanying drawings.

It will be understood that when an element is referred to as being 'on' or "under" another element, it can be directly on/under the element, and one or more intervening elements may also be present. When an element is referred to as being 'on' or 'under', 'under the element' as well as 'on the element' can be included based on the element.

The thickness and size of each layer may be exaggerated, emitted or illustrated schematically in the drawings, for explanation and precision. The size of each component shown in the drawings may not reflect the actual size completely.

FIGS. 1a through 1g are diagrams illustrating a method of manufacturing a light emitting device according to a first embodiment.

First of all, as shown in FIG. 1a, a substrate 100 is prepared and the substrate 100 includes a conductive substrate or an insulative substrate. For example, the substrate 100 may include at least one of sapphire ($Al_2O_3$), SiC, Si, GaAs, GaN, ZnO, Si, GaP, InP, Ge or $Ga_2O_3$. An uneven structure may be formed on the substrate 100 and the embodiment is not limited thereto. Wet cleaning may be performed to the substrate 100 and impurities may be eliminated from a surface of the substrate 100.

On the substrate 100 may be formed a light emitting structure 120 including a first conductivity type semiconductor layer 122, an active layer 124 and a second conductivity type semiconductor layer 126.

At this time, a buffer layer (not shown) may grow between the light emitting structure 120 and the substrate 100, to reduce lattice mismatch of materials and a difference of coefficients of thermal expansion. The buffer layer may be formed of a 3-5 group compound semiconductor, for example, at least one of GaN, InN, AlN, InGaN, AlGaN, InAlGaN or AlInN. An undoped layer may be formed on the buffer layer and the embodiment is not limited thereto.

Also, the light emitting structure 120 may grow according to vapor deposition such as metal organic chemical vapor deposition (MOCVD), molecular beam epitaxy (MBE) and hydride vapor phase epitaxy (HYPE).

The first conductivity type semiconductor layer 122 may be realized by a 3-5 group compound semiconductor having a first conductivity type dopant doped thereon. In case the first conductivity type semiconductor layer 122 is an N-type semiconductor layer, the first conductivity type dopant may include Si, Ge, Sn, Se and Te as N-type dopant and the embodiment is not limited thereto.

The first conductivity type semiconductor layer 122 may include a semiconductor material having an empirical formula: $Al_xIn_yGa_{(1-x-y)}N$ ($0 \leq x \leq 1$, $0 \leq y \leq 1$, $0 \leq x+y \leq 1$). The first conductivity type semiconductor 122 may be formed of one or more of GaN, InN, AlN, InGaN, AlGaN, InAlGaN, AlInN, AlGaAs, InGaAs, AlInGaAs, GaP, AlGaP, InGaP, AlInGaP or InP.

The first conductivity type semiconductor 122 may form an N-type layer by using CVD, MBE, sputtering or HYPE. Also, the first conductivity type semiconductor layer 122 may be formed by injecting into a chamber silane gas ($SiH_4$) including N-type impurities such as silicon (Si), trimethylgallium gas (TMGa), ammonia gas ($NH_3$) and nitrogen gas ($N_2$).

The active layer 124 is a layer configured to emit a light having a predetermined energy determined by an unique energy band of a material forming an active layer (light emitting layer), after an electron injected via the first conductivity type semiconductor layer 122 meets a hole injected via the second conductivity type semiconductor layer 126 which will be formed later.

The active layer 124 may be formed in at least one of Single Quantum Well structure, Multi Quantum Well (MQW) structure, Quantum-Wire structure or Quantum Dot structure. For example, at least one of trimethylgallium gas (TMGa), ammonia gas ($NH_3$), nitrogen gas ($N_2$) or trimethylindium gas (TMIn) are injected to form the active layer 130 in MQW structure, and the embodiment is not limited thereto.

A well layer/barrier layer structure of the active layer 124 may be formed of a pair of or more pairs of InGaN/GaN, InGaN/InGaN, GaN/AlGaN, InAlGaN/GaN, GaAs(InGaAs)/AlGaAs, GaP(InGaP)/AlGaP and the embodiment is not limited thereto. The well layer may be formed of material with a predetermined band gap that is lower than a band gap of the barrier layer.

A conductivity type clad layer (not shown) may be formed on and/or under the active layer 124. The conductivity type clad layer may be formed of AlGaN-based semiconductor and it may have a higher band gap than the band gap of the active layer 124.

The second conductivity type semiconductor layer 126 may include a 3-5 group compound semiconductor having a second conductivity type dopant doped thereon, for example, a semiconductor material having a following empirical formula: $In_xAl_yGa_{1-x-y}N$ ($0 \leq x \leq 1$, $0 \leq y \leq 1$, $0 \leq x+y \leq 1$). If the second conductivity type semiconductor layer 126 is a p-type semiconductor layer, the second conductivity type dopant may include Mg, Zn, Ca, Sr and Ba as p-type dopant.

The second conductivity type semiconductor 126 may form a P-type GaN layer by injecting bisethylcyclopentadienyl magnesium (EtCp$_2$Mg) {(Mg(C$_2$H$_5$C$_5$H$_4$)$_2$) having p-type impurity such as magnesium (Mg), trimethyl gallium gas (TMGa), ammonia gas (NH$_3$) and nitrogen gas (N$_2$) into a chamber, and the embodiment is not limited thereto.

This embodiment may present that the first conductivity type semiconductor layer 122 is a p-type semiconductor layer and that the second conductivity type semiconductor type layer 126 is an n-type semiconductor layer. On the second conductivity type semiconductor layer 126 may be formed a semiconductor having an opposite polarity to a polarity of the second conductivity type, for example, an n-type semiconductor layer (not shown) if the second conductivity type semiconductor layer is a p-type semiconductor layer. Because of that, the light emitting structure 120 may be realized in one of N—P, N—P—N or P—N—P junction structures.

Figure 1B:
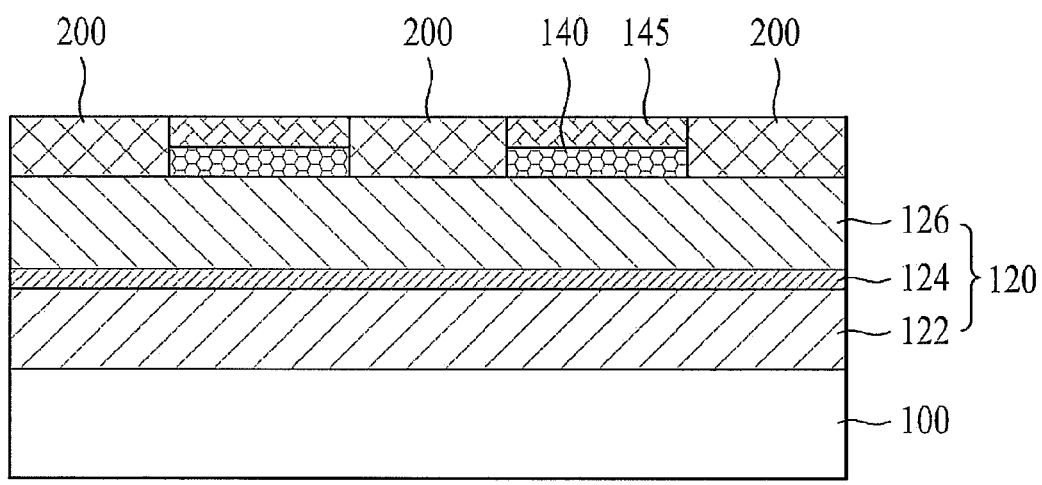
Figure 1C:
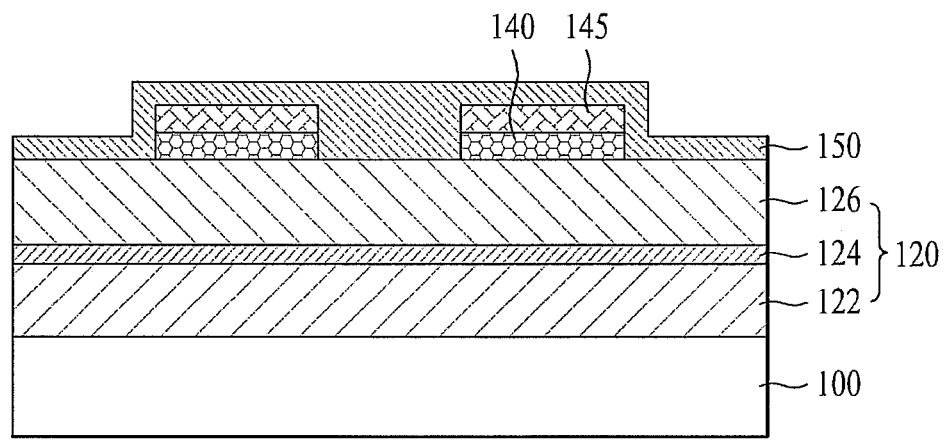

As shown in FIG. 1b, a mask 200 is covered on the light emitting structure 120 and an ohmic layer 140 and a reflection layer 145 are formed thereon. At this time, the ohmic layer 140 and the reflection layer 145 may not be formed on an area corresponding to a center of the light emitting structure 120. This area may be corresponding to an area where a first electrode 180 will be formed, which will be described later.

The ohmic layer 140 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au or Hf and the ohmic layer of the embodiment is not limited to these materials. The ohmic layer 140 may be formed according to sputtering or electron beam vapor deposition.

The reflective layer 145 may be a metal layer including an Al, Ag, Pt, Rh, or an alloy comprising Al, Ag, Pt or Rh. Aluminum or silver can reflect the light generated from the active layer 124 effectively, to improve light extraction efficiency of the light emitting device remarkably.

Figure 1D:
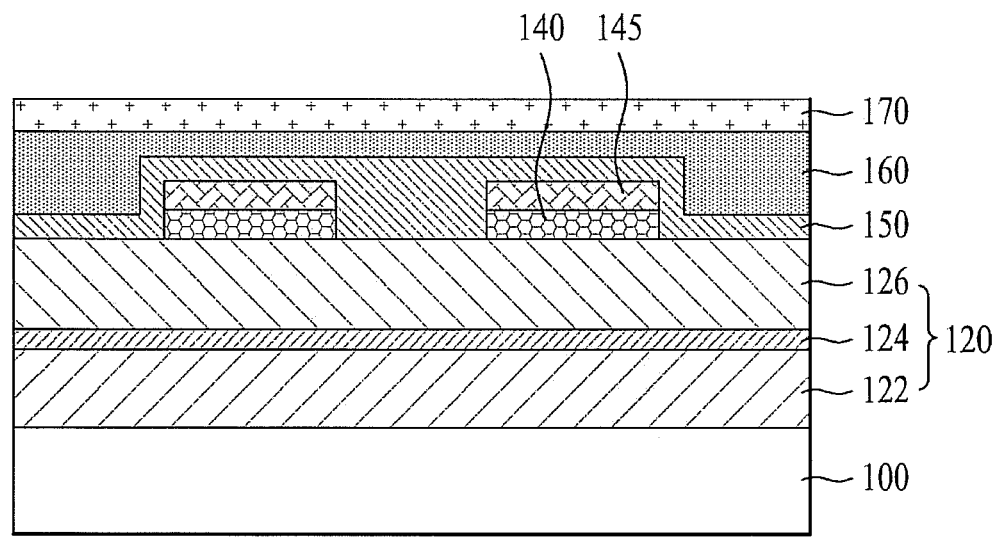

As shown in FIG. 1d, a silicide layer 150 is formed on the reflection layer 145. The silicide layer 150 may be a compound of Si and at least one material selected from a group composed of Ni, Pt, Ti, W, Cu, V, Fe and Mo, and it may be deposited according to sputtering or electric beam deposition. In FIG. 1d, the silicide layer 150 may be deposited to be a single layer. However, it may be deposited to be a plurality of layers. Considering characteristics of the device, the thickness of the silicide layer 150 may be equal to 100 angstroms or less. As shown in FIG. 1d, the silicide layer 150 may partially contact with the exposed second semiconductor layer 126.

A conductive supporting substrate 170 may be formed on the silicide layer 150. The conductive supporting substrate 170 may be formed of at least one material selected from a group composed of Mo, Si, W, Cu, Al or an alloy of the group. The conductive supporting substrate 170 may include at least one of Au, Cu Alloy, Ni or Cu—W and a carrier wafer (for example, GaN, Si, Ge, GaAs, ZnO, SiGe, SiC, SiGe and Ga$_2$O$_3$) selectively. A method of forming the conductive supporting substrate 170 may be electrochemical metal deposition or eutectic metal bonding.

Here, to adhere the reflection layer 150 and the conductive supporting substrate 170 to each other, an adhesion layer 160 may be formed of at least one material selected from a group composed of Au, Sn, In, Al, Si, Ag, Ni, Cu or an alloy of the group.

Figure 1E:
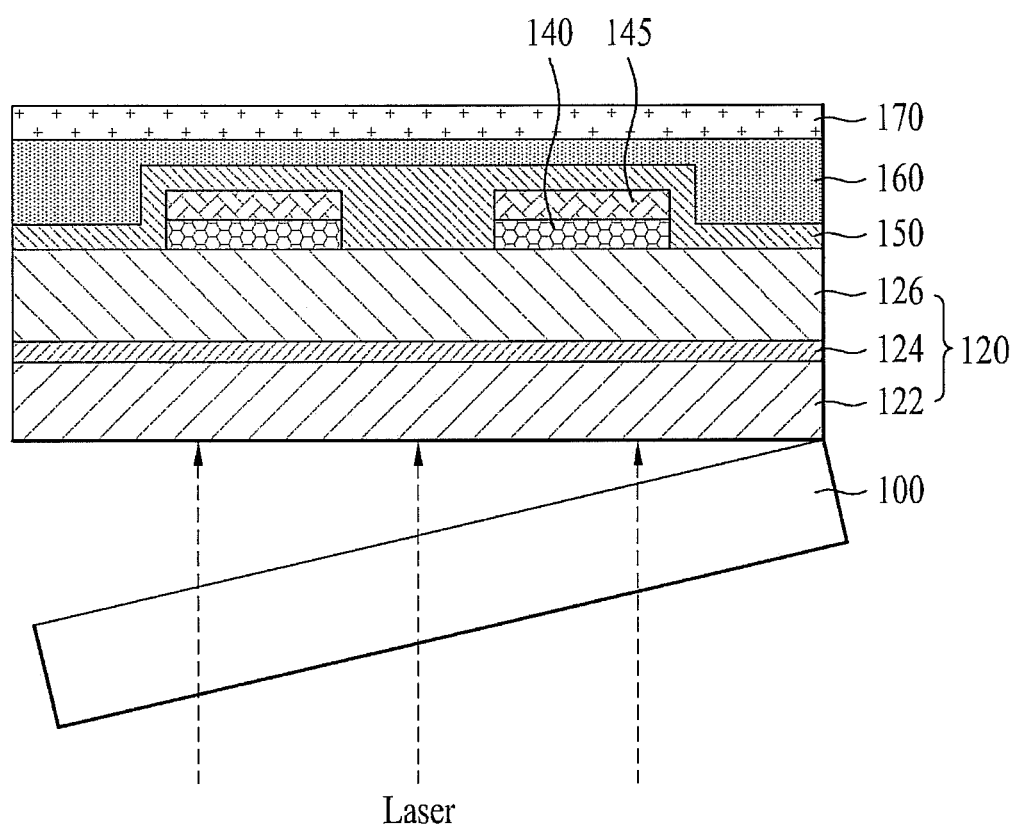

Hence, the substrate 100 is detached as shown in FIG. 1e.

The substrate 100 may be detached according to Laser Lift Off (LLO) which uses an excimer layer or dry and wet etching.

In case of Laser Lift Off (LLO), an excimer layer having a predetermine wavelength is focused and irradiated toward the substrate 100. After that, a thermal energy is concentrated on a boundary surface between the substrate 100 and the light emitting structure 120 such that the boundary surface is divided into gallium particles and nitrogen particles to detach the substrate 100 at an area passing the laser thereon in a moment.

Figure 1F:
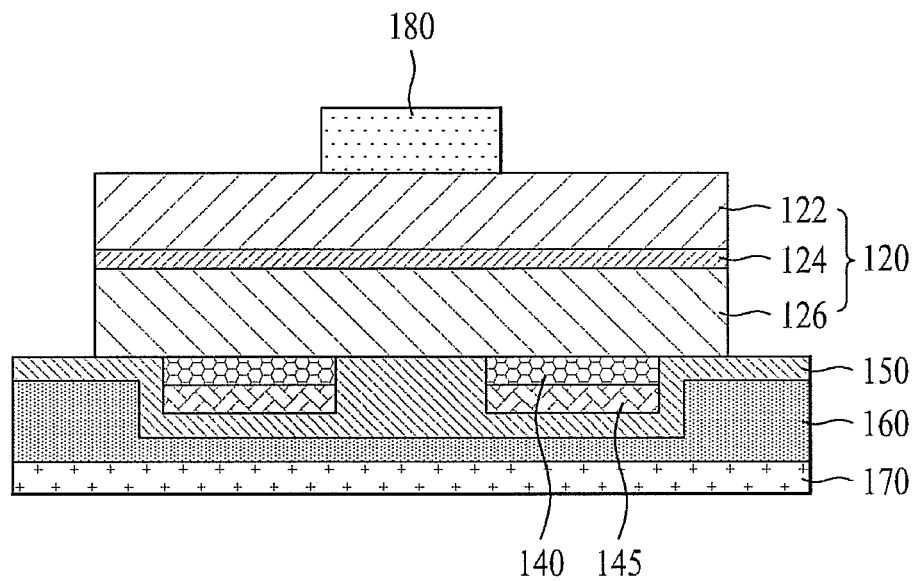

As shown in FIG. 1f, a first electrode is formed on the first conductivity type semiconductor layer 122. The first electrode 180 is formed of one or more of molybdenum (Mo), chromium (Cr), nickel (Ni), gold (Au), aluminum (Al), titanium (Ti), platinum (Pt), vanadium (V), tungsten (W), lead (Pd), copper (Cu), rhodium (Rh), iridium (Ir) or an alloy of these metals. The first electrode 180 may be provided corresponding to an open area formed on the second conductivity type semiconductor layer 126, where the ohmic layer 140 is not provided. FIG. 1f illustrates a light emitting device having a process of dicing chips performed completely.

Figure 1G:
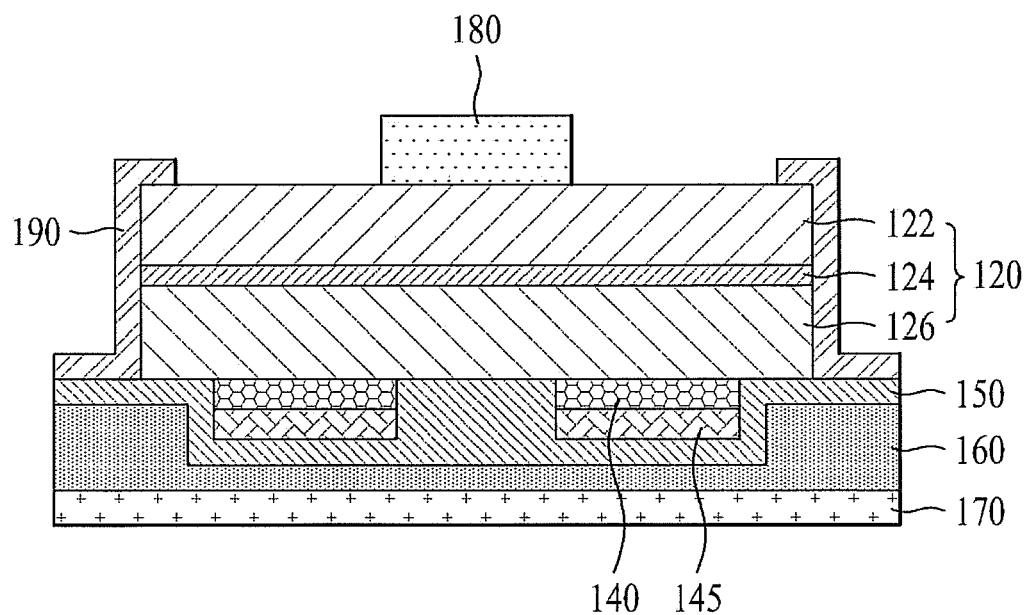

As shown in FIG. 1g, a passivation layer 190 may be deposited on a side surface of the light emitting structure 120. Here, the passivation layer 190 may be formed of an insulative material and the insulative material may be an oxide or a nitride which is non-conductive. For example, the passivation layer 200 may be composed of at least one of a silicon oxide layer (SiO$_2$) layer, an oxynitride layer and an aluminum oxide layer.

FIGS. 2a through 2h are diagrams illustrating a method of a light emitting device according to a second embodiment.

Figure 2A:
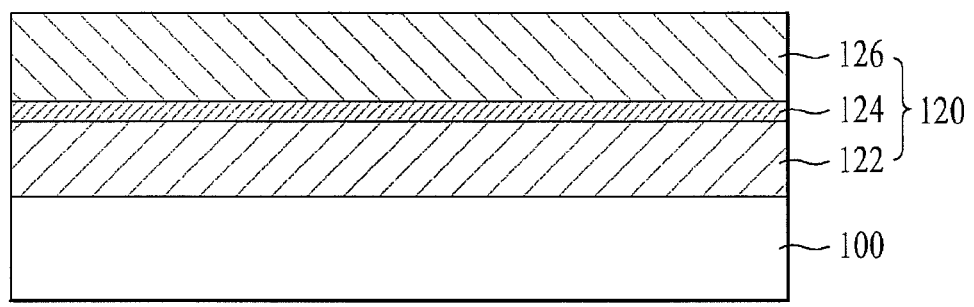
FIGS. 2a through 2h are diagrams illustrating a method of manufacturing a light emitting device according to a second embodiment.

First of all, as shown in FIG. 2a, a light emitting structure 120 grow on a substrate 100, which is the same as shown in FIG. 1a.

Figure 2B:
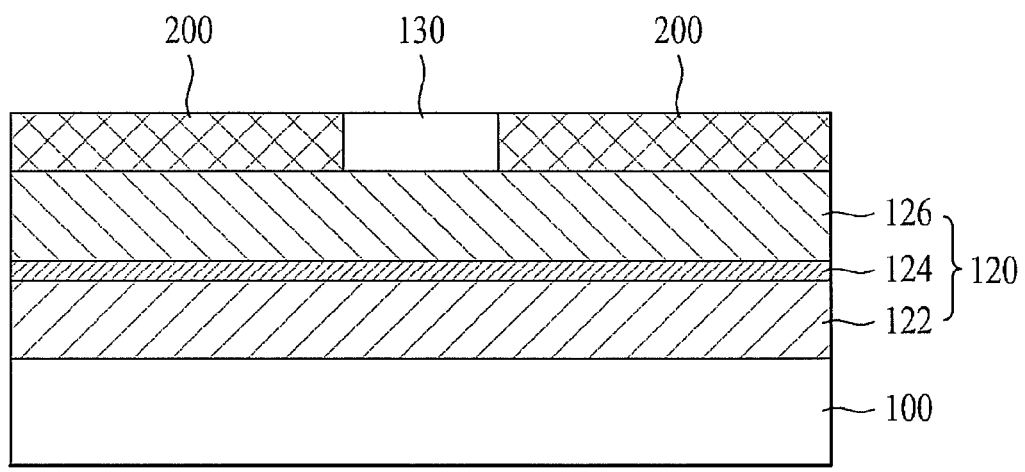

Hence, as shown in FIG. 2b, a current blocking layer 130 is patterned on the second conductivity type semiconductor layer 126 by using a mask 200. The current blocking layer 130 may be formed of a dielectric substance or metal to block a current from being concentrated on the center of the light emitting structure 120.

Figure 2C:
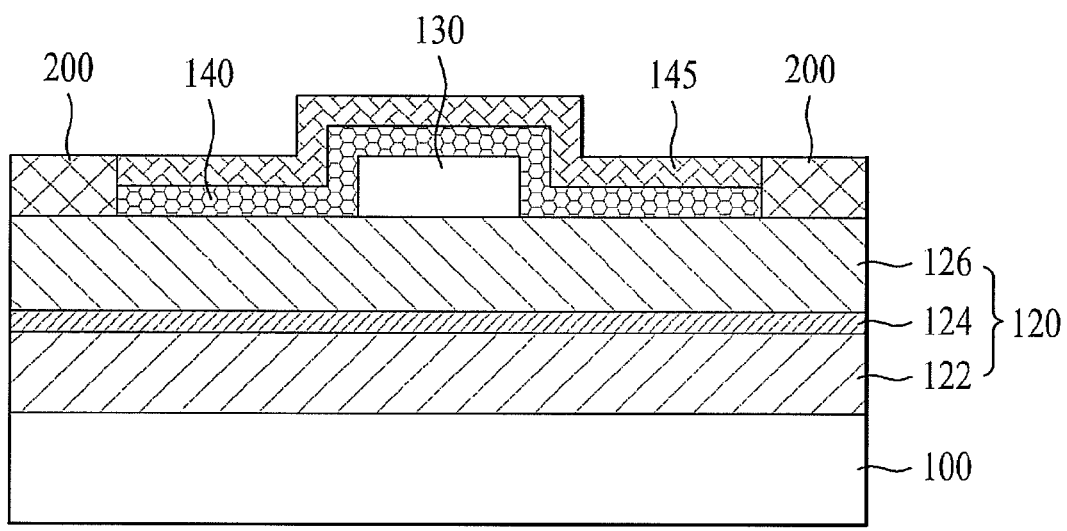

As shown in FIG. 2c, an ohmic layer 140 and a reflection layer 145 may be formed on the second conductivity type semiconductor layer 126 and the current blocking layer 130 by using the mask 200. Here, the composition of the ohmic layer 140 and the reflection layer 145 may be the same as the composition in reference to the first embodiment. At this time, an edge area of the second conductivity type semiconductor layer 126 may be open as shown in FIG. 2c.

Figure 2D:
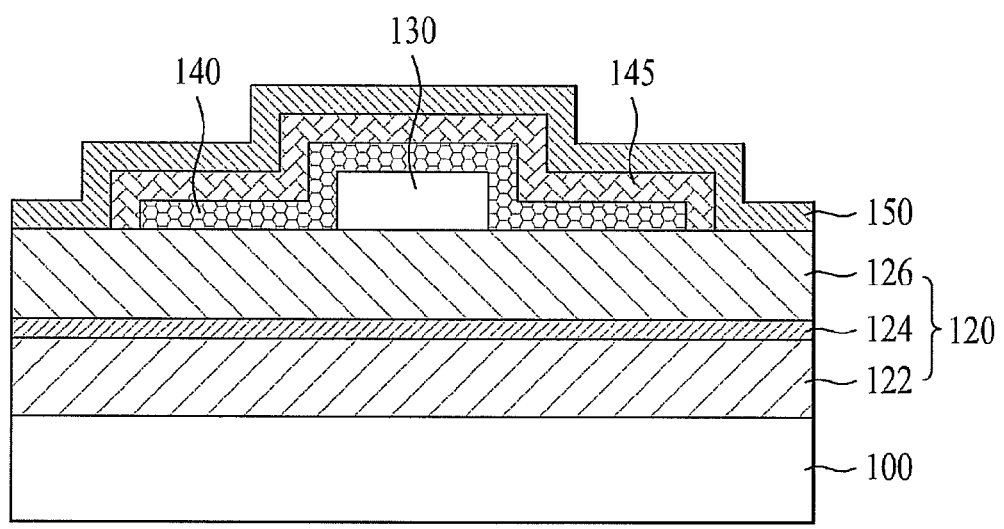

After that, as shown in FIG. 2d, a silicide layer 150 is formed on the reflection layer 145. The silicide layer 150 may be a compound of Si and at least one material selected from a group composed of Ni, Pt, Ti, W, Cu, V, Fe and Mo, and it may be deposited according to sputtering or electric beam deposition. In FIG. 1d, the silicide layer 150 may be deposited to be a single layer. However, it may be deposited to be a plurality of layers. As shown in FIG. 2d, the silicide layer 150 may partially contact with the exposed second semiconductor layer 126.

Figure 2E:
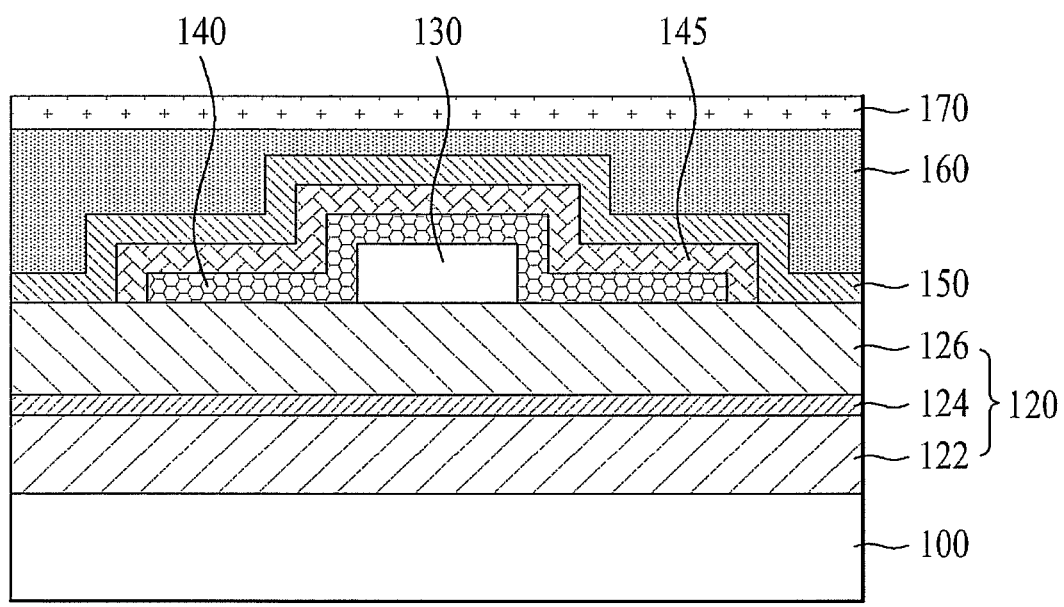

Hence, as shown in FIG. 2e, a reflection layer (an adhesion layer 160) and a conductive supporting layer 170 may be formed on the silicide layer 150. The specific composition thereof is the same as the composition in reference of the first embodiment.

Figure 2F:
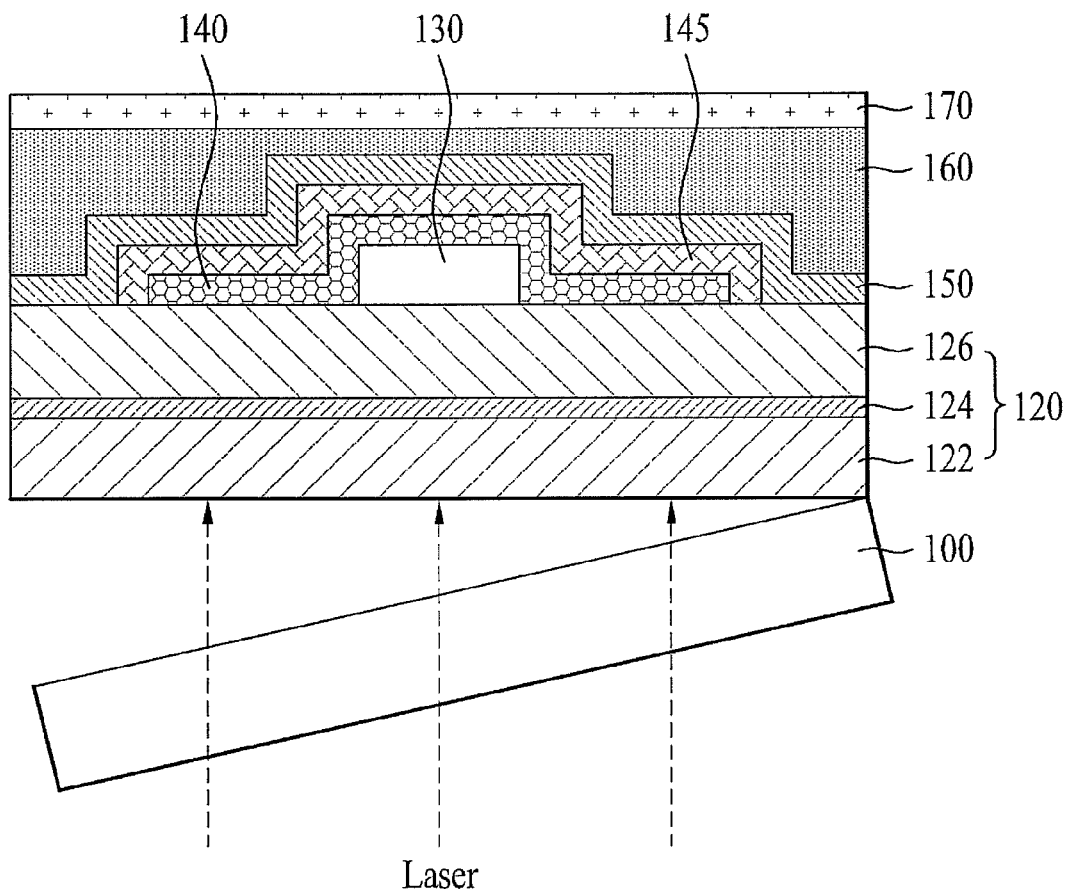
Figure 2G:
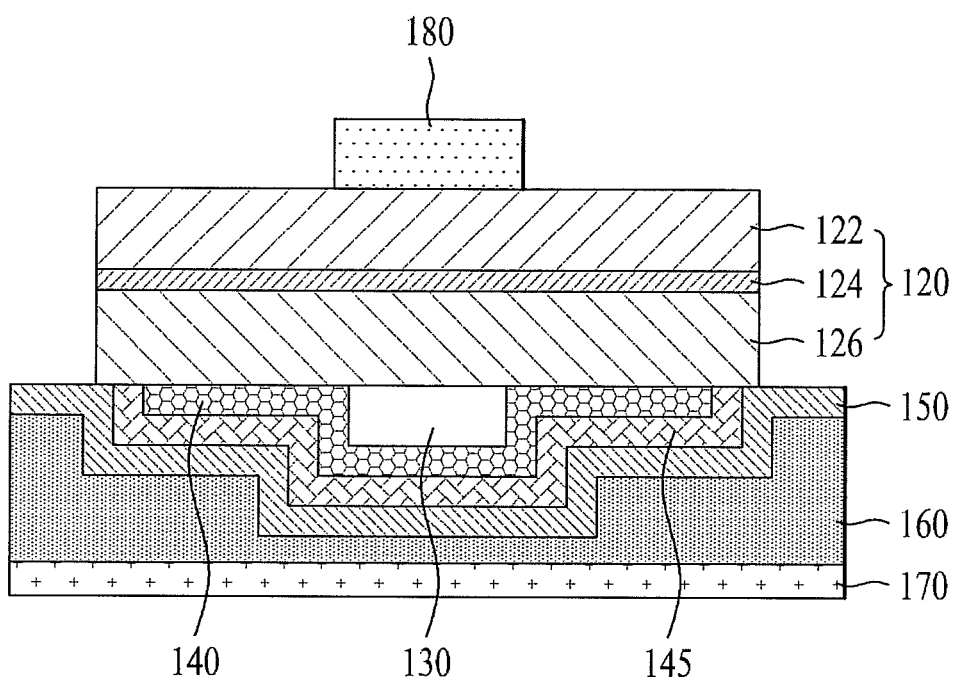

As shown in FIG. 2f, the substrate 100 is eliminated according to Laser Lift Off (LLO) and the like. As shown in FIG. 2g, a first electrode 180 is formed on the first conductivity type semiconductor layer 122. At this time, the first electrode 180 may be provided on an area corresponding to the current blocking layer 130.

Figure 2H:
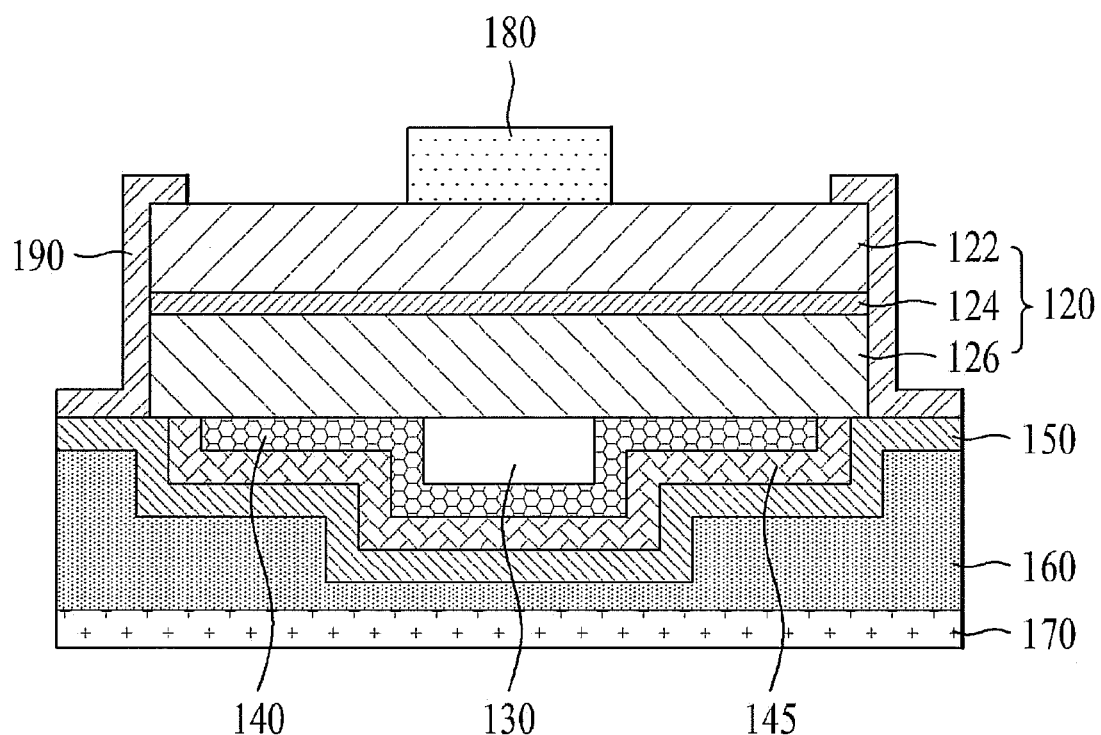

As shown in FIG. 2h, a passivation layer 190 may be deposited on a side surface of the light emitting structure 120.

FIGS. 3a through 3g are diagrams illustrating a method of manufacturing a light emitting device according to a third embodiment.

Figure 3A:
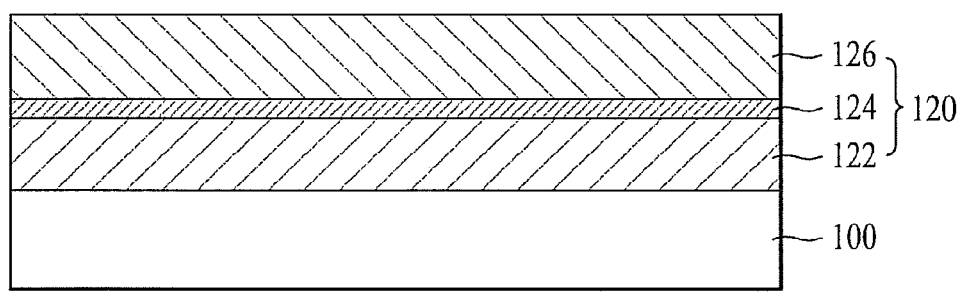
FIGS. 3a through 3h are diagrams illustrating a method of manufacturing a light emitting device according to a third embodiment.

First of all, as shown in FIG. 3a, a light emitting structure 120 grow on a substrate 100, which is the same as shown in FIG. 1a.

Figure 3B:
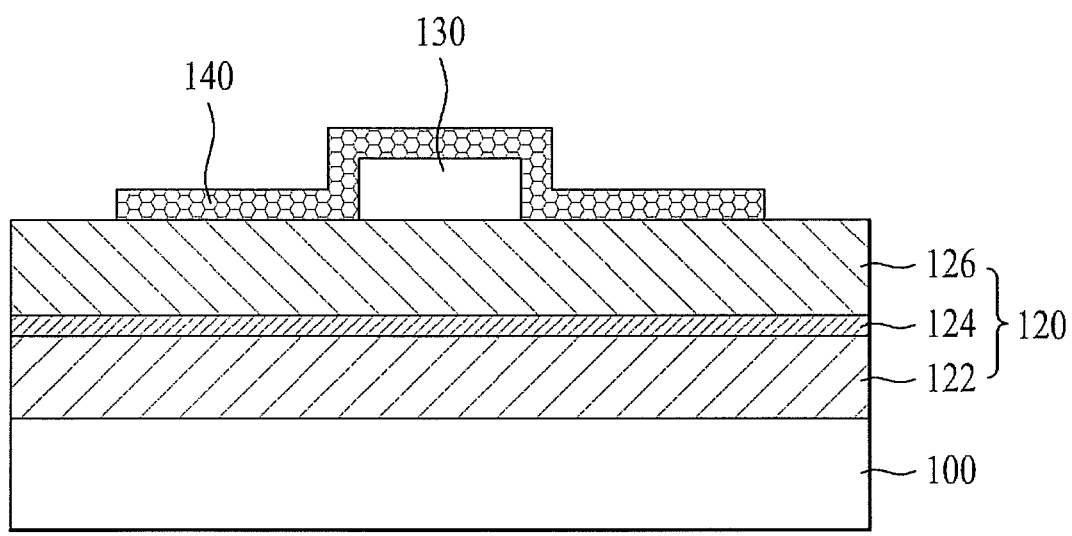

As shown in FIG. 3b, a current blocking layer 130 is patterned on the second conductivity type semiconductor layer 126 and an ohmic layer 140 is formed to cover the current blocking layer 130. The composition of the ohmic layer is the same as mentioned above.

Figure 3C:
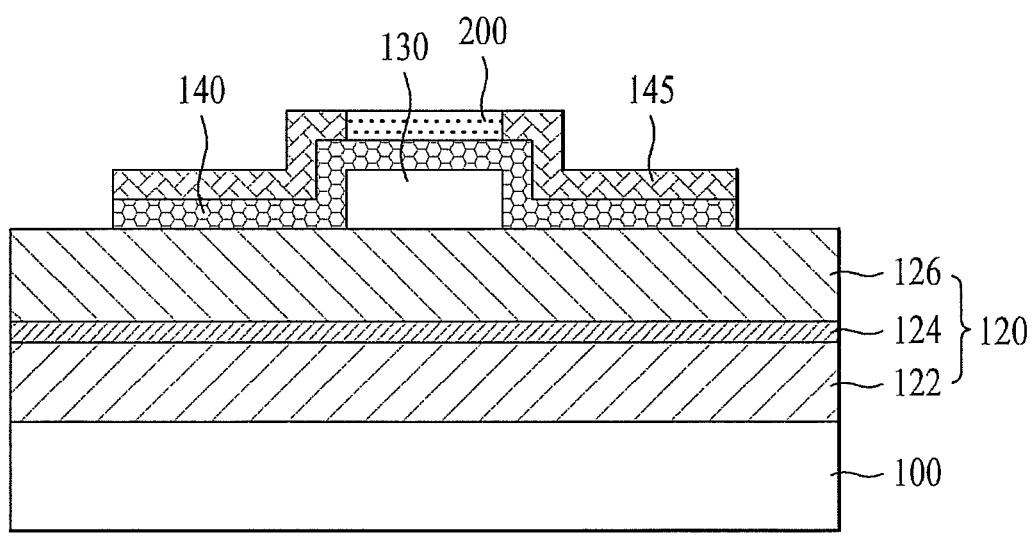

Hence, as shown in FIG. 3c, a mask is covered on the ohmic layer 140 and a reflection layer 145 is patterned and deposited. The reflection layer 145 may be deposited not to be provided at an area corresponding to the current blocking layer 130. The composition of the reflection layer 145 is the same as mentioned above.

Figure 3D:
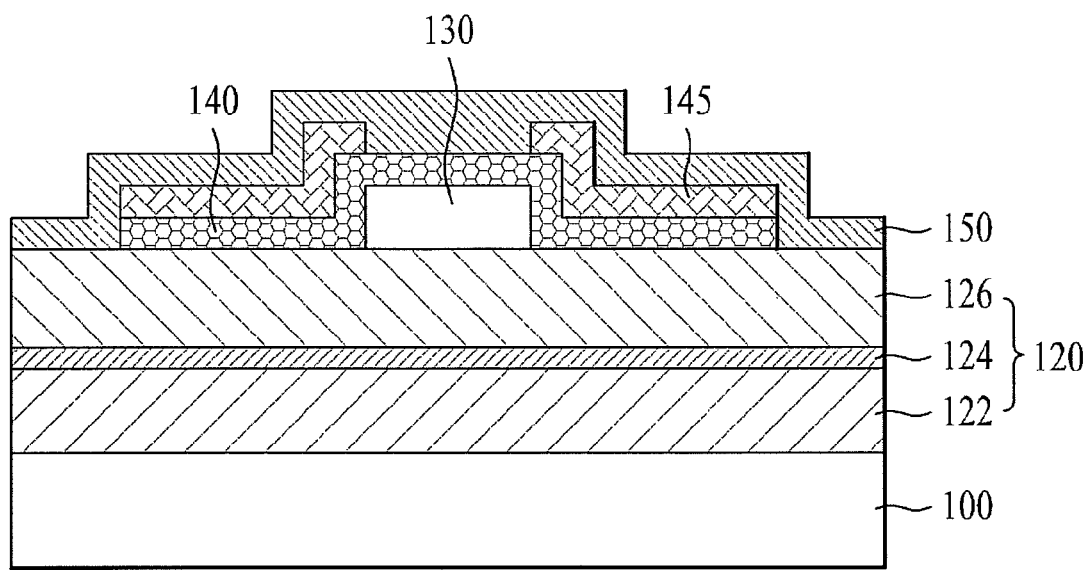

As shown in FIG. 3d, a silicide layer 150 is formed to cover the second conductivity type semiconductor layer 126, the ohmic layer 140 and the reflection layer 145. The silicide layer 150 may be a compound of Si and a material selected from a group composed of Ni, Pt, Ti, W, Cu, V, Fe and Mo, and it may be deposited according to sputtering or electric beam deposition. In FIG. 1d, the silicide layer 150 may be deposited to be a single layer. However, it may be deposited to be a plurality of layers.

Here, the reflection layer 145 may be not provided in a center area of the light emitting structure and the ohmic layer 140 may contact with the silicide layer 150 at the center area.

Figure 3E:
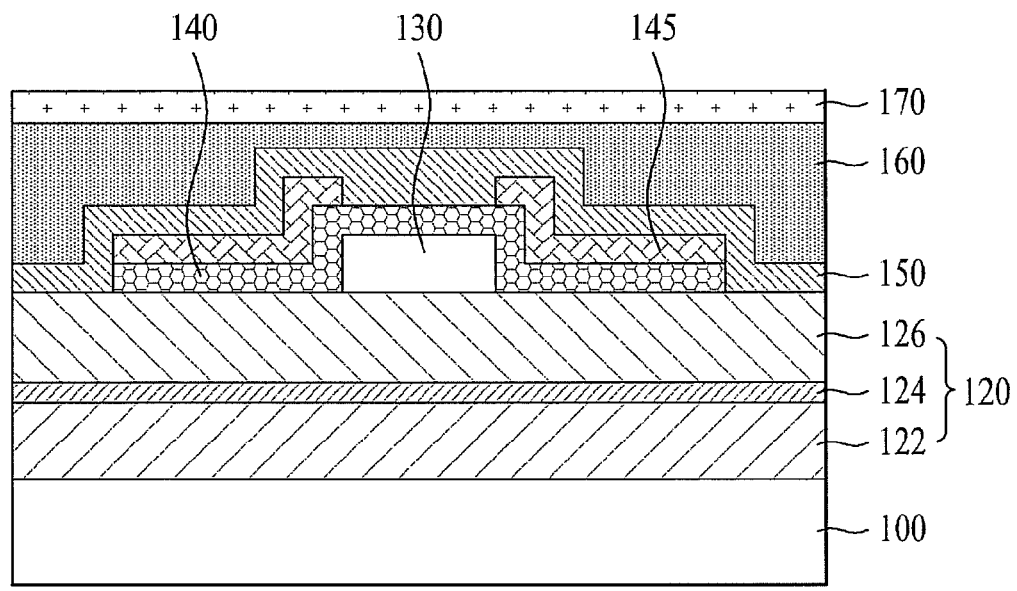

After that, as shown in FIG. 3e, an adhesive layer 160 and a conductive supporting substrate 170 may be formed on the silicide layer 150. The composition of the adhesive layer 160 and the conductive supporting substrate 170 is the same as mentioned above.

Figure 3F:
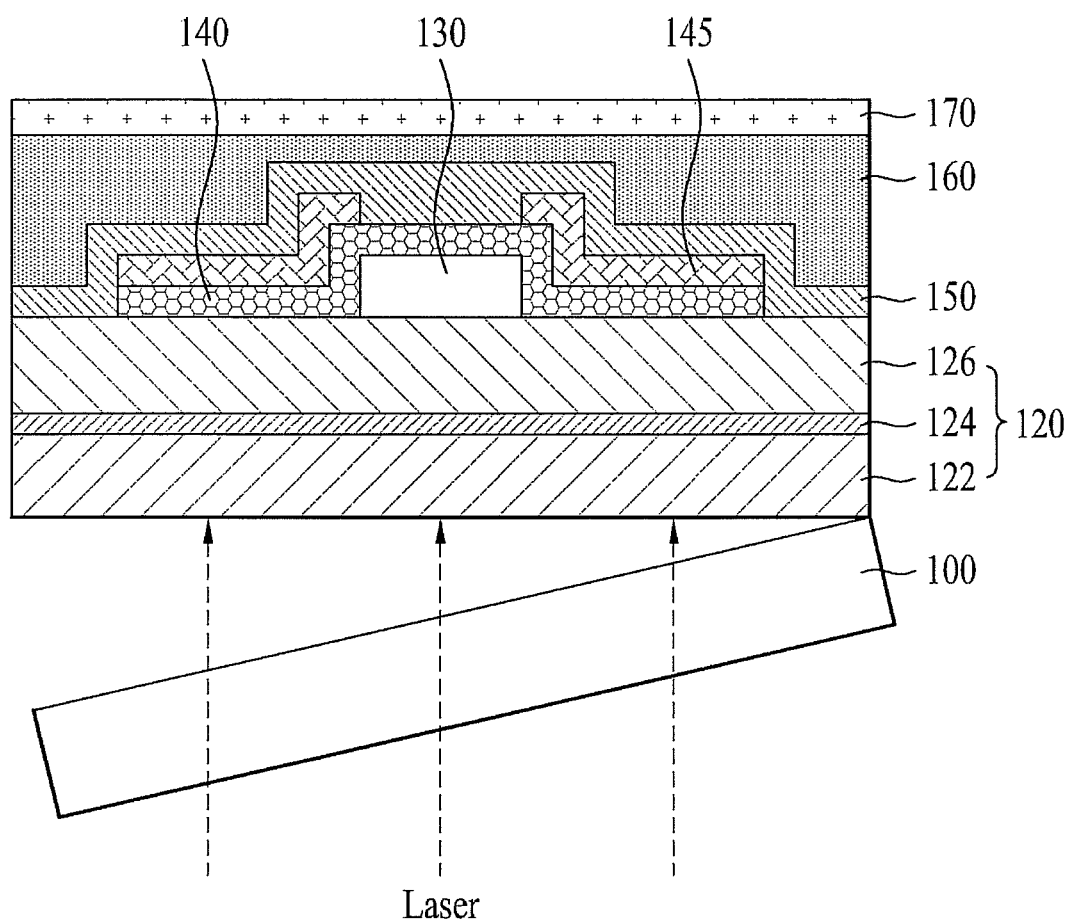
Figure 3G:
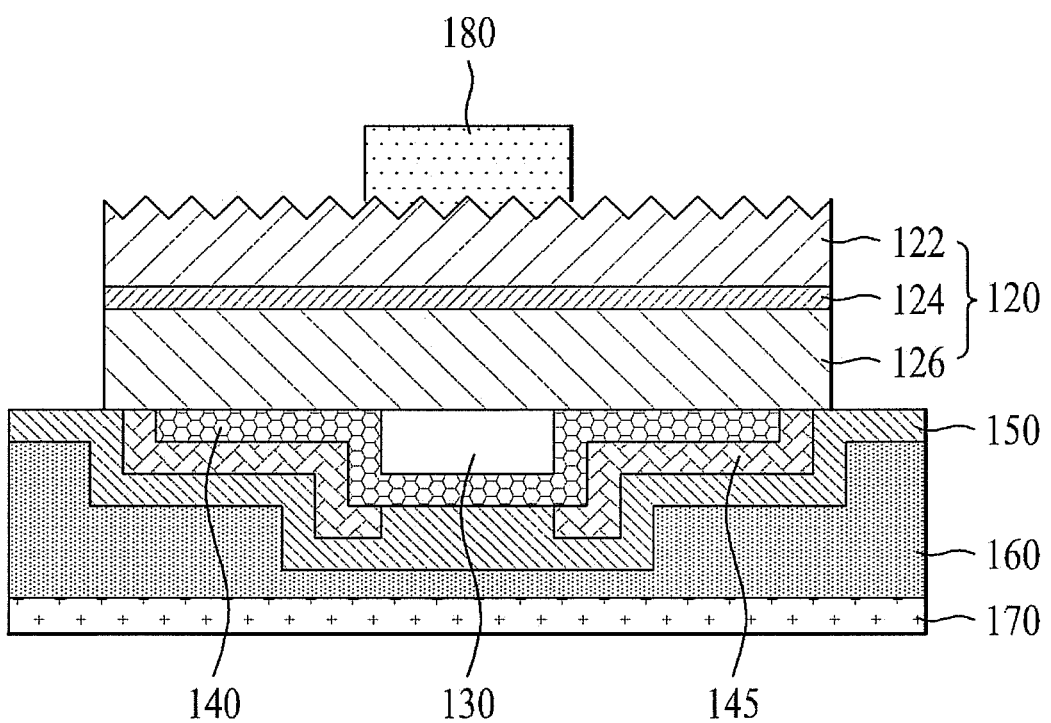

As shown in FIG. 3f, the substrate 100 is eliminated. A first electrode 180 is formed on the first conductivity type semiconductor layer 122 as shown in FIG. 3g. According to this embodiment, an unevenness may be formed on a surface of the first conductivity type semiconductor layer 122. An uneven shape of the surface of the first conductivity type semiconductor layer 122 may be formed by PEC or etching after forming a mask. Here, the quantity of etching liquid (for example, KOH), the intensity and the exposure time of UV, a difference between etching velocities of Gallium-polar and Nitrogen-polar and a difference between etching velocities based on GaN crystallinity may be controlled. Because of that, the shape of the unevenness with a microsize may be controlled.

According to the etching process which uses the mask, a photoresist is coated on the first conductivity type semiconductor layer 122 and a lithography process is performed by using a mask after that. When the lithography process is performed, the process is developed and an etching pattern is formed. According to the process mentioned above, the etching pattern is formed on the first conductivity type semiconductor layer 122. While the etching process is performed, the uneven structure is formed on the first conductivity type semiconductor layer 122. The uneven structure is configured to increase a surface area of the first conductivity type semiconductor layer 122. As the number of crests and troughs is larger, it is more preferable.

Figure 3H:
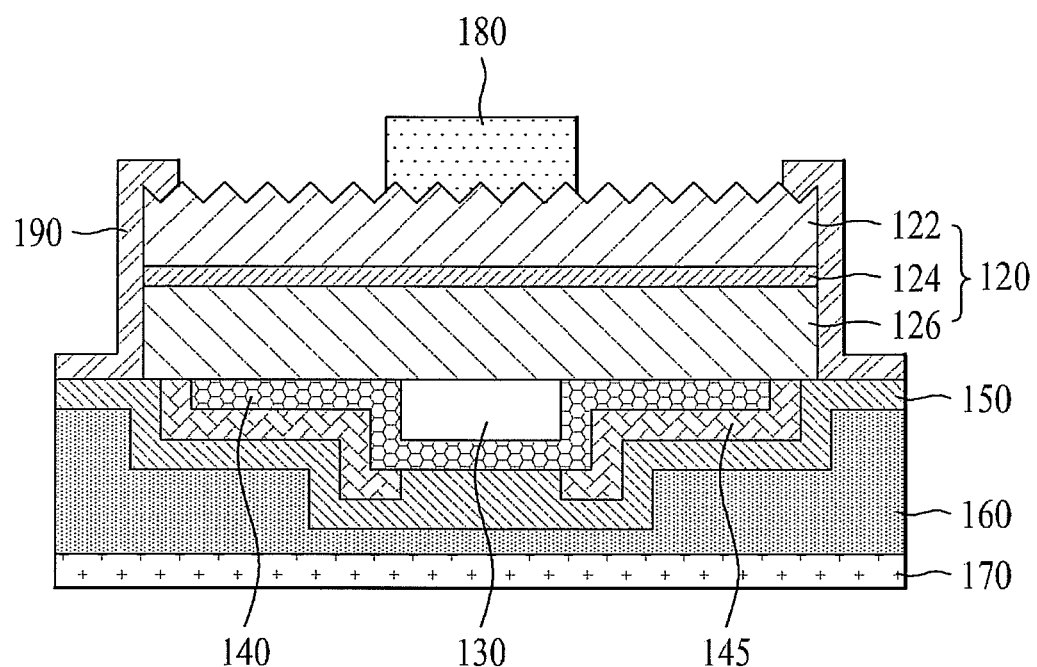

After that, as shown in FIG. 3h, a passivation layer 190 may be formed on a side surface of the light emitting structure 120.

In the embodiments of the light emitting structure mentioned above, the silicide layer is covering the ohmic layer and the reflection layer which are formed on the light emitting structure, and it may be employed as barrier between the reflection layer and the adhesive layer. In the first embodiment, the ohmic layer and the reflection layer are not provided in the center area of the light emitting structure and the silicide layer can prevent diffusion of materials contained in the ohmic layer and the reflection layer. Because of that, stability of the device can be expected.

Figure 4:
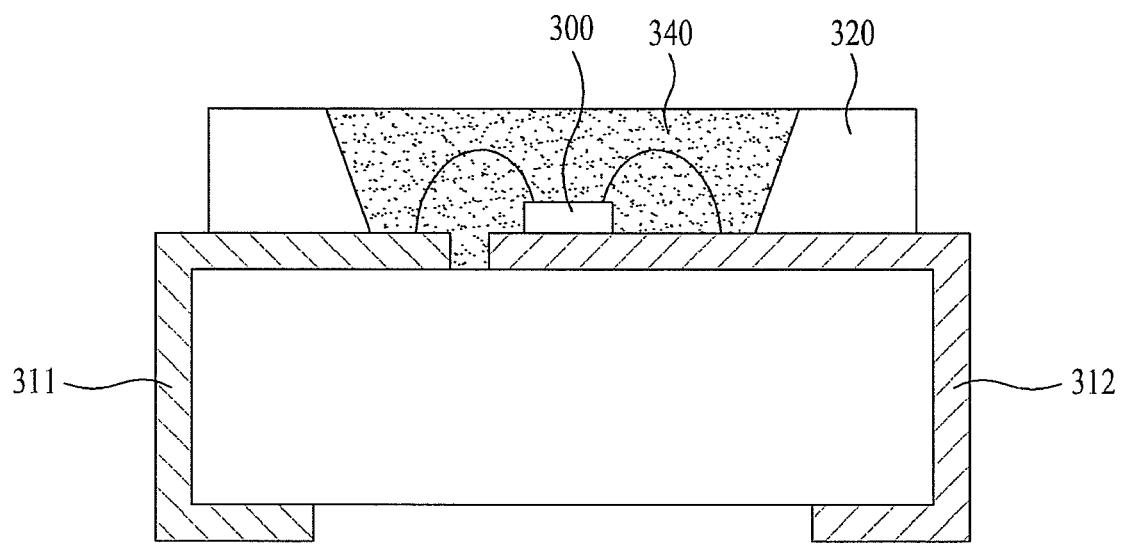
FIG. 4 is a diagram illustrating a light emitting device package according to an embodiment.

FIG. 4 is a sectional view illustrating a light emitting device package according to an embodiment. As follows, the light emitting device package according to the embodiment will be described in reference to FIG. 4.

As shown in FIG. 4, the light emitting device package according to the embodiment includes a package body 320, first and second electrodes 311 and 312 installed in the package body 320, a light emitting device 300 according to the embodiments mentioned above installed in the package body 320, with being electrically connected with the first and second electrodes 311 and 312, and a molding part 340 surrounding the light emitting device 300.

The package body 320 includes a silicon material, a synthetic material or a metal material. A slope is formed adjacent to the light emitting device 300 and light extraction efficiency may be enhanced accordingly.

The first electrode 311 and the second electrode 312 are electrically separated from each other, and they provide the light emitting device 300 with an electric power. In addition, the first and second electrodes 311 and 312 reflect the lights generated from the light emitting device 300, to improve luminous efficiency, and they may exhaust the heat generated from the light emitting device 300 outside.

The light emitting device 300 may be disposed on the package body 320 or either of the first and second electrodes 311 and 312.

The light emitting device 300 may be electrically connected with the first and second electrodes 311 and 312 by wire-bonding, flip chip-bonding or die-bonding.

The molding part 340 surrounds the light emitting device 300 to protect the light emitting device 300. A phosphor is provided in the molding part 340 and the wavelength of the light emitted from the light emitting device may be changed by the phosphor.

At least one or a plurality of the light emitting devices according to the embodiments described above may be mounted on the light emitting device package, and the embodiment is not limited thereto.

Figure 5:
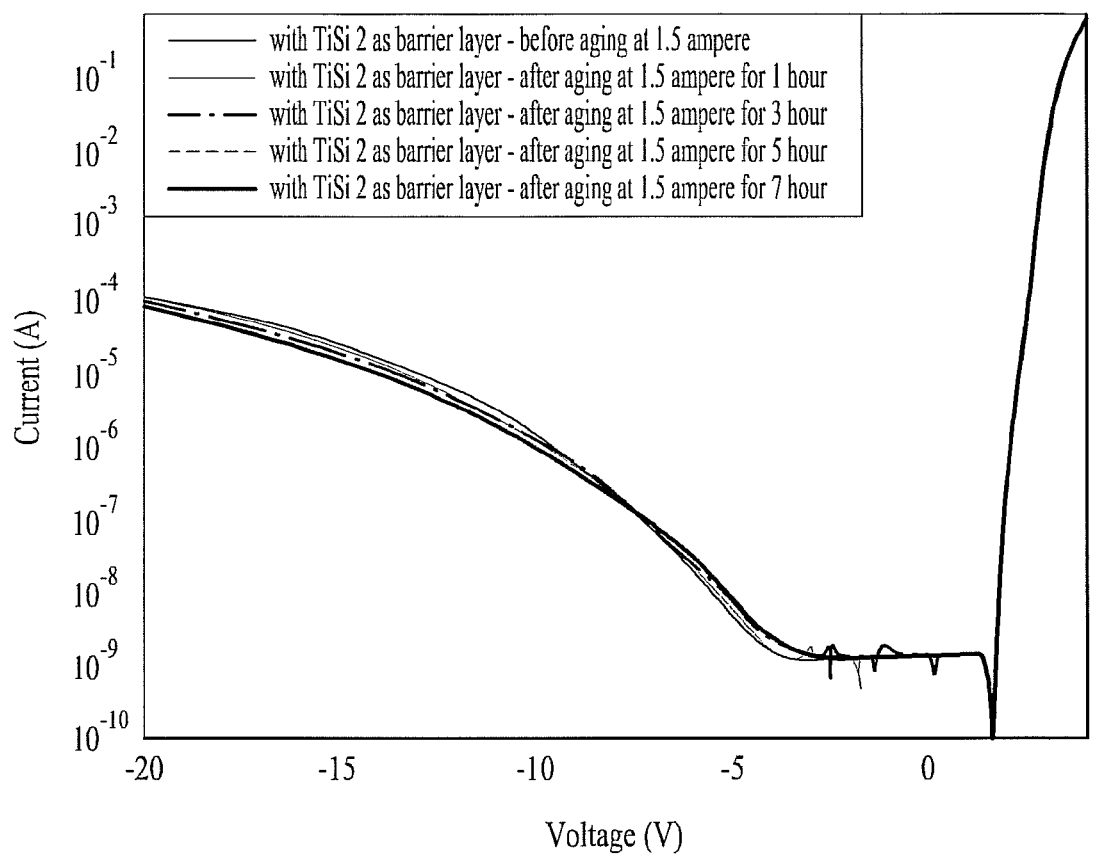
FIGS. 5 and 6 are diagrams illustrating an effect of the light emitting device according to the embodiments.
Figure 6:
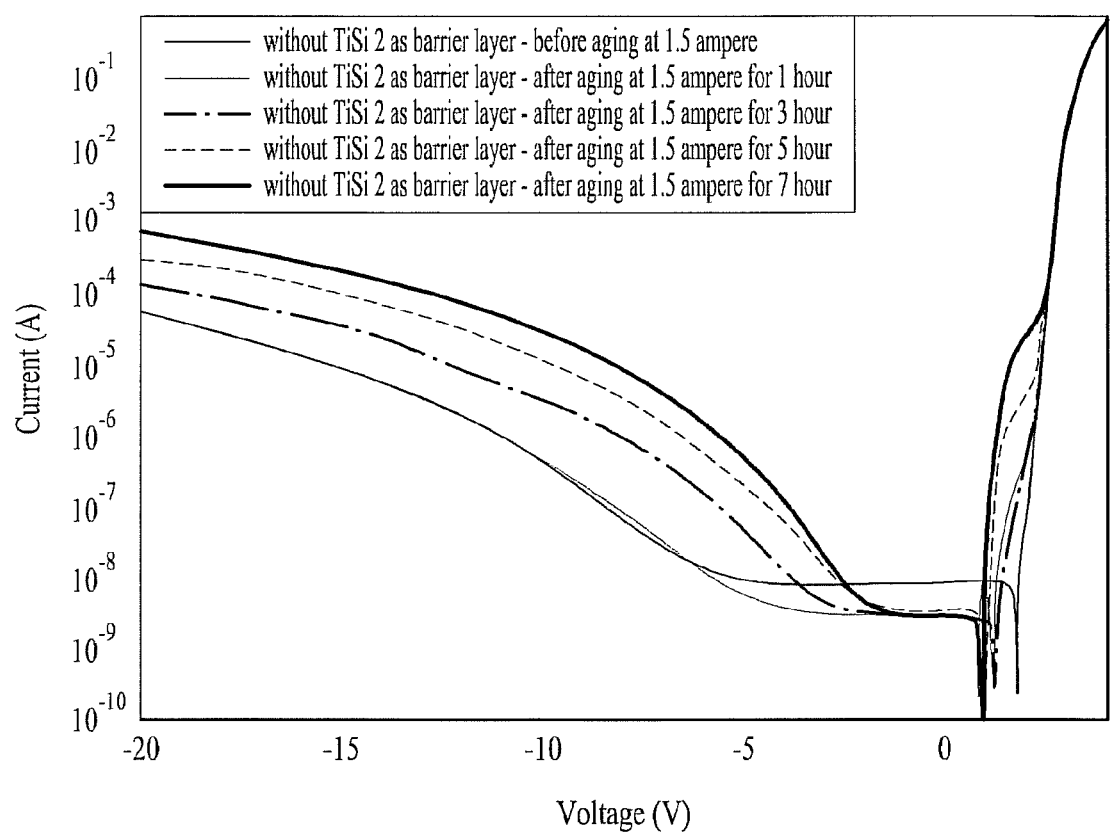

FIGS. 5 and 6 are diagrams illustrating an effect of the light emitting device according to the embodiments. FIG. 5 is a graph illustrating a relationship between a voltage and a current of a vertical light emitting device including a silicide layer. FIG. 6 is a graph illustrating a relationship between a voltage and a current of a light emitting device including no silicide layer.

When a test is performed at a current of 1.5 ampere (A) for different hours, it is shown that degradation is generated at a low current area of the structure without the silicide layer.

The plurality of the light emitting device packages according to the embodiment may be arrayed on a substrate, and a light guide plate, a prism sheet and a diffuser sheet, which are optical members, may be disposed on a light passage of the light emitting device package. Such the light emitting device package, the substrate and the optical members may be functioned as light unit. Another embodiment may present a display device, a pointing device and a lightening system which includes the semiconductor light emitting device or light emitting device package disclosed in the embodiments described above. For example, the lightening system may include a lamp and a streetlamp.

Figure 7:
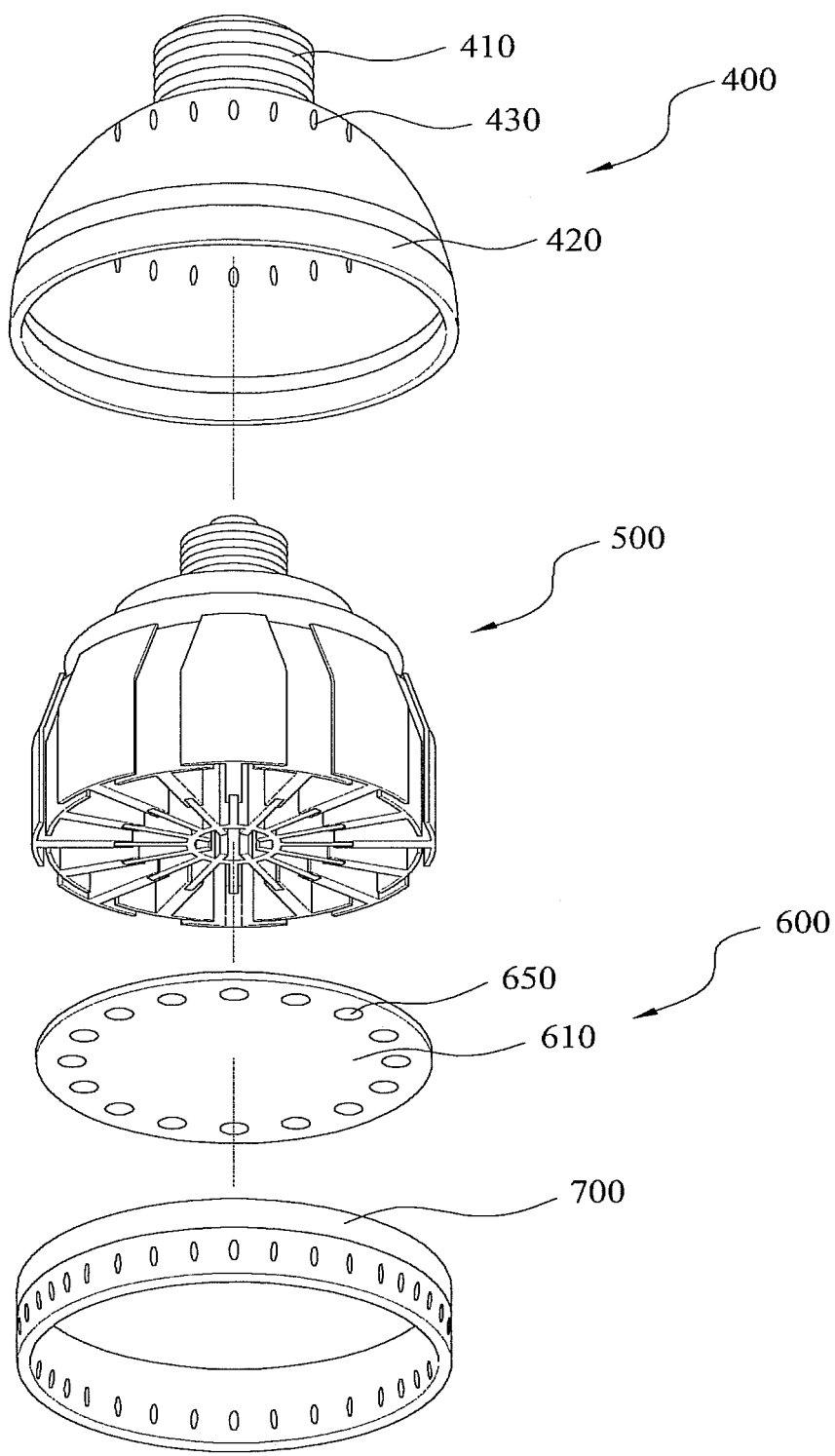
FIG. 7 is an exploded perspective view illustrating a lightening device according to an embodiment which includes the light emitting device package according to the embodiment.

FIG. 7 is an exploded perspective view illustrating a lightening device according to an embodiment, with the light emitting device package according to the embodiments mentioned above.

The lightening device according to this embodiment includes a light source 600 configured to project a light, a housing 400 where the light source 600 is mounted, a heat radiating part 500 configured to radiate the heat of the light source 600, and a holder 700 configured to connect the light source 600 and the heat radiating part 500 with the housing 400.

The housing 400 includes a socket-secured part 410 secured to an electric socket (not shown) and a body part 420 connected with the socket-secured part 410, with the light source 600 mounted therein. A single air hole 430 may be formed through the body part 420.

The plurality of the air holes 430 may be formed in the body part 420 of the housing 400. The air hole 430 may be configured of a single hole or the plurality of the air holes may be disposed in a radial direction as shown in FIG. 7. Here, various arrangements of the plurality of the air holes may be possible, rather than the radial arrangement thereof.

The light source 600 includes a substrate 610 and a plurality of light emitting device packages 650 disposed on the substrate 610. The substrate 610 may have a predetermined shape which is able to be inserted in an open part of the housing 400.

The light emitting device package 650 includes at least one light emitting device and the light emitting device includes the silicide layer as mentioned in the embodiments above.

The holder 700 may be provided under the light source and it may include a frame and another air hole. Although not shown in the drawing, optical members may be provided under the light source 600 and lights emitted from the light emitting device package 650 may be diffused, scattered or collected accordingly.

Figure 8:
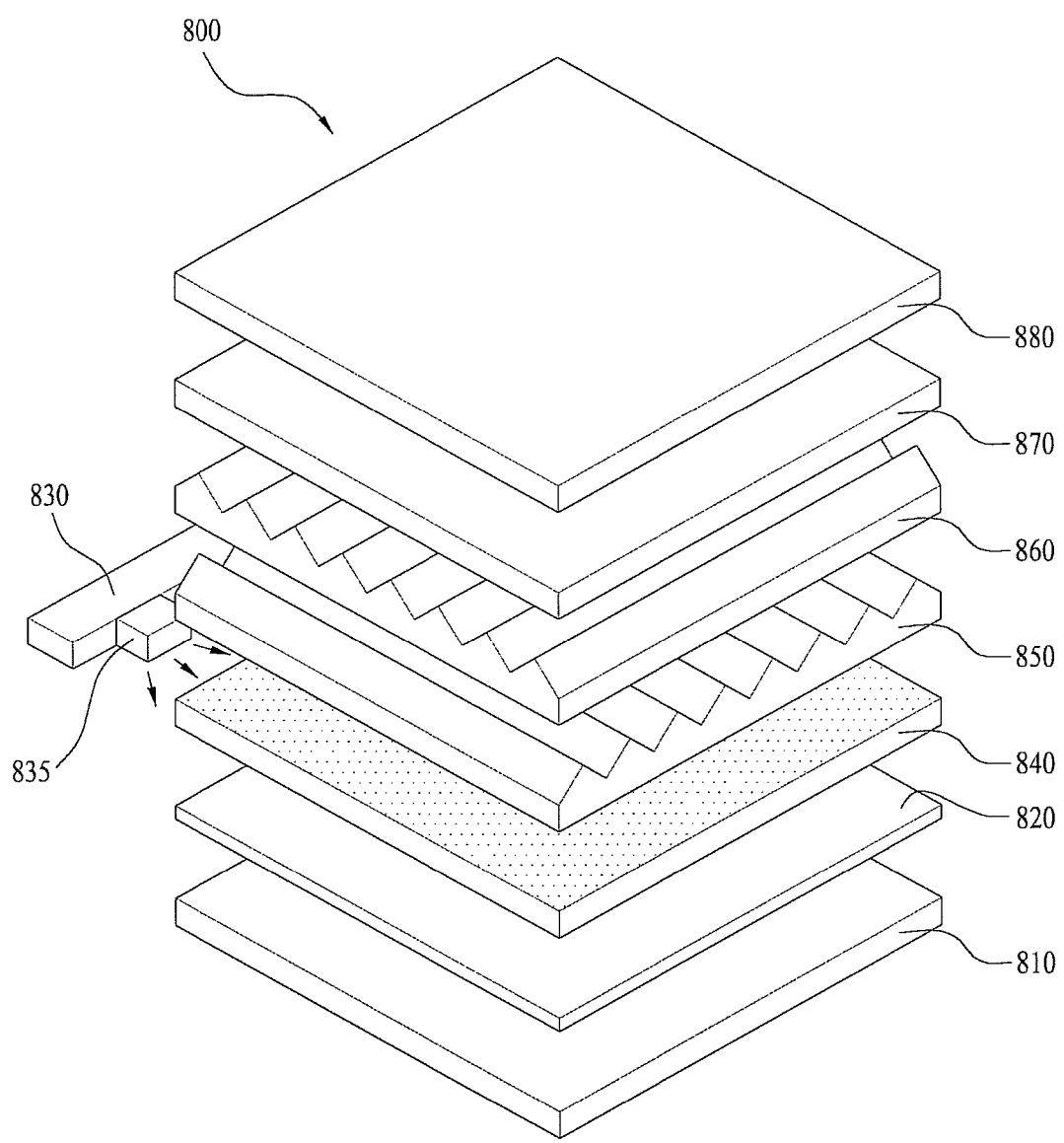
FIG. 8 is a diagram illustrating a backlight including the light emitting device package according to the embodiment.

FIG. 8 is a diagram illustrating a backlight according to an embodiment which includes the light emitting device package according to the embodiments.

As shown in FIG. 8, a display device 800 according to this embodiment includes light source modules 830 and 835, a reflective plate 820 provided on a bottom cover 820, a light guide plate 840 disposed on a front of the reflective plate 820 to guide a light emitted from the light source modules forwardly, first and second prism sheets 850 and 860 disposed on a front of the light guide plate 840, a panel 870 disposed on a front of the second prism sheet 860, and a color filter 880 disposed on an overall area of the panel 870.

The light source module includes a light emitting device package 835 provided on a substrate 830. Here, the substrate 830 may be a PCB and the light emitting device package 835 is described above.

The light emitting device package 835 includes at least one light emitting device and the light emitting device includes the silicide layer as mentioned in the embodiments above.

The bottom cover 810 may hold inner components of the display device 800. The reflective plate 820 may be an auxiliary component as shown in the drawing or the reflective sheep 820 formed of a material having high reflectivity may be coated on a front surface of the bottom cover 810.

The material which can be used for an ultra-thin film type with a high reflectivity may be used for the reflective plate 820 and polyethylene terephtalate (PET) may be used for the reflective plate 820.

The light guide plate 840 scatters the lights emitted from the light emitting device package to distribute the lights to an overall screen area of a liquid crystal display device uniformly. Because of that, the light guide plate 840 may be formed of a material having a good refractive index and transmissivity, for example, polymethylmethacrylate (PMMA), polycarbonate (PC) and polyethylene (PE). Alternatively, the light guide plate 840 may omitted and air may be employed as optical waveguide.

Alternatively, the light guide plate 840 is omitted and the light reflected from the reflective plate 820 may travel toward the panel directly, which is an air guide type.

The first prism sheet 850 is formed in a surface of a supporting film and it is formed of polymer having transparency and elasticity. The polymer may have prism layers having a plurality of dimensional structures formed repeatedly. Here, the plurality of the patterns may be a stripe type having crests and troughs formed repeatedly, as shown in the drawing.

A direction of the crests and troughs formed in the surface of the supporting film provided in the second prism sheet 860 may be perpendicular to a direction of the crests and troughs formed in the surface of the supporting film provided in the first prism sheet 850. This is because the lights transmitted from both of the light source module and the reflective sheet have to be distributed along a forward direction of the panel 870 uniformly.

Although not shown in the drawing, a protection sheet may be provided on each of the prism sheets and the protection sheet may include a light diffusive element and a binder provided on both surfaces of the supporting film.

The prism layer may be formed of at least one material selected from a group composed of polyurethane, butadiene-styrene copolymers, polyacrilate, Polymethacrylate, Polymethyl Methacrylate, polyethylene terephthalate elastomer, polyisoprene or polysilicon.

Although not shown in the drawing, a diffuser sheet may be disposed between the light guide plate 840 and the first prism sheet 850. The diffuser sheet may be formed of a polyester/polycarbonate-based material and a light incident from a backlight unit may be refracted and scattered. Because of that, a light projection angle may be broadened as much as possible.

The diffuser sheet includes a supporting layer having a light-diffusing agent and first and second layers formed in a light emitting surface (toward the first prism sheet) and a light incident surface (toward the reflective sheet), respectively, with no light-diffusing agent.

The supporting layer may include a siloxane-based light diffusing agent 0.1-10 weight part, having an average particle size of 1-10 micrometers and an acryl-based light diffusing agent 0.1~10 weight part, having an average particle size of 1~10 micrometers, with respect to a resin 100 weight part which is mixed with methacrylic acid-styrene copolymer and methyl methacrylate-styrene copolymer.

The first and second layers may include an ultraviolet ray absorbent 0.01~1 weight part and an antistic agent 0.0001~10 weight part, with respect to a methyl methacrylate-styrene copolymer resin 100 weight part.

The thickness of the supporting layer provided in the diffuser sheet may be 100~10000 micrometers and the thickness of each of the first and second layers may be 10~1000 micrometers.

According to this embodiment, the diffuser sheet, the first prism sheet 850 and the second prism sheet 860 compose an optical sheet. The optical sheet may be configured of another composition of a micro-lens array, a diffuser sheet and a micro-lens array or of a single prism sheet and a micro-lens array, for example.

The panel 870 may arrange a liquid crystal display thereon and other types of display devices requiring a light source may be provided, rather than the liquid crystal display panel.

In the panel 870, liquid crystal is located between glass bodies and a polarizer is lifted on the glass bodies to uses polarization of lights. The liquid crystal has an in-between property of liquid and solid. Liquid crystal which is an organic molecule is disposed regularly like crystal and a property of the molecule arrangement changed by an external field is used to display an image.

The liquid crystal display used in the display device has an active matrix type which uses a transistor as switch adjusting a voltage supplied to each of pixels.

The color filter 880 is provided on a front surface of the panel 870 and it transmits only red, green blue lights of the light projected from the panel 870 via pixels. Because of that, the image may be presented.

It will be apparent to those skilled in the art that various modifications and variations can be made in the embodiment without departing from the spirit or scope of the embodiments. Thus, it is intended that the embodiment covers the modifications and variations of this embodiment provided they come within the scope of the appended claims and their equivalents.

What is claimed is:

1. A light emitting device comprising:
   a light emitting structure comprising a first conductivity type semiconductor layer, an active layer and a second conductivity type semiconductor layer;
   a first electrode disposed on the first conductivity type semiconductor layer;
   an ohmic layer disposed on a predetermined area of the second conductivity type semiconductor layer;
   a silicide layer disposed on the ohmic layer, and in contact with the second conductivity type semiconductor layer; and
   a conductive supporting substrate disposed on the silicide layer.

2. The light emitting device of claim 1, wherein the ohmic layer is disposed to expose the second conductivity type semiconductor layer partially and the silicide layer covers the ohmic layer, with contacting at least one area of the second conductivity type semiconductor layer directly.

3. The light emitting device of claim 1, wherein the silicide layer is composed of a plurality of layers.

4. The light emitting device of claim 1, wherein the silicide layer is comprising of Si and at least one of Ni, Pt, Ti, W, Cu, V, Fe or Mo.

5. The light emitting device of claim 1, wherein the silicide layer contacts at least one area of the second conductivity type semiconductor layer directly, corresponding to the first electrode.

6. The light emitting device of claim 1, wherein the ohmic layer is patterned to expose the second conductivity type semiconductor layer partially.

7. The light emitting device of claim 1, further comprising:
   a reflection layer disposed between the ohmic layer and the silicide layer and in contact with the second conductivity type semiconductor.

8. The light emitting device of claim 7, further comprising:
   a current blocking layer disposed between the second conductivity type semiconductor layer and the ohmic layer.

9. The light emitting device of claim 8, wherein the silicide layer contacts at least one area of the ohmic layer directly, corresponding to the first electrode.

10. The light emitting device of claim 1, further comprising:
    an adhesive layer arranged between the silicide layer and the conductive supporting substrate.

11. The light emitting device of claim 1, wherein a passivation layer is formed on a side surface of the light emitting structure and at least one area of the siliside layer.

12. The light emitting device of claim 1, wherein a roughness is formed on a surface of the first conductivity type semiconductor layer.

13. A light emitting device package comprising:
    a package body in which a cavity is formed;
    first and second electrode layers disposed on the package body that are electrically separated from each other; and
    a light emitting device disposed on the cavity that is electrically connected with the first and second electrode layers,
    wherein the light emitting device comprises a light emitting structure comprising a first conductivity type semiconductor layer, an active layer and a second conductivity type semiconductor layer; a first electrode disposed on the first conductivity type semiconductor layer; an ohmic layer disposed on the second conductivity type semiconductor layer; a silicide layer disposed on the ohmic layer and in contact with the second conductivity type semiconductor layer; and a conductive supporting substrate disposed on the silicide layer.

14. The light emitting device package of claim 13, wherein the ohmic layer is disposed to expose the second conductivity type semiconductor layer partially and the silicide layer covers the ohmic layer, with contacting at least one exposed area of the second conductivity type semiconductor layer directly.

15. The light emitting device package of claim 13, wherein the silicide layer is comprising of Si and at least one of Ni, Pt, Ti, W, Cu, V, Fe or Mo.

16. The light emitting device package of claim 13, wherein the silicide layer contacts at least one area of the second conductivity type semiconductor layer directly, corresponding to the first electrode.

17. The light emitting device package of claim 13, wherein further comprising:
    a current blocking layer disposed between the second conductivity type semiconductor layer and the silicide layer.

18. The light emitting device package of claim 17, wherein the silicide layer contacts at least one area of the ohmic layer directly, corresponding to the first electrode.

19. An image display device comprising:
    a circuit board;
    a light emitting device package disposed on the circuit board, the light emitting device package comprising a package body in which a cavity is formed; first and second electrode layers disposed on the package body, with being electrically separated from each other; and a light emitting device disposed on the cavity, with being electrically connected with the first and second electrode layers;
    an optical member configured to project a light emitted from the light emitting device package; and a panel comprising a first transparent substrate, a second transparent substrate, a plurality of liquid crystals disposed between the first and second transparent substrate and a polarizing plate disposed on each of the first and second transparent substrates, wherein the light emitting device comprises a light emitting structure comprising a first conductivity type semiconductor layer, an active layer and a second conductivity type semiconductor layer; a first electrode disposed on the first conductivity type semiconductor layer; an ohmic layer disposed on a predetermined area of the second conductivity type semiconductor layer; a silicide layer disposed on the ohmic layer, and in contact with the second conductivity type semiconductor layer; and a conductive supporting substrate disposed on the silicide layer.

20. The image display device of claim 19, wherein the ohmic layer is disposed to expose the second conductivity type semiconductor layer partially and the silicide layer covers the ohmic layer, with contacting at least one exposed area of the second conductivity type semiconductor layer directly.

* * * * *